United States Patent [19]

Chirovsky et al.

[11] Patent Number: 5,343,032
[45] Date of Patent: Aug. 30, 1994

[54] DIODE-CLAMPED OPTICAL RECEIVER

[75] Inventors: Leo M. F. Chirovsky, Bridgewater, N.J.; Anthony L. Lentine, St. Charles, Ill.

[73] Assignee: AT&T Bell Laboratories, Murray Hill, N.J.

[21] Appl. No.: 45,006

[22] Filed: Apr. 8, 1993

[51] Int. Cl.[5] .............................. H01J 40/14
[52] U.S. Cl. ........................ 250/208.2; 250/214 R
[58] Field of Search ............... 250/208.2, 208.4, 551, 250/214.1, 214 LS, 566, 214 R; 307/311; 359/189

[56] References Cited

U.S. PATENT DOCUMENTS

| | | | |
|---|---|---|---|
| 3,849,632 | 11/1974 | Eckert et al. | 250/566 |
| 4,754,132 | 6/1988 | Hinton et al. | 250/211 J |
| 4,985,621 | 1/1991 | Aull et al. | 250/213 A |
| 5,198,656 | 3/1993 | Chirovsky | 250/214 LS |

OTHER PUBLICATIONS

C. R. Giles et al., "All-Optical Regenerator", *Electronics Letters*, vol. 24, No. 14, Jul. 7, 1988, pp. 848–850.
T. K. Woodward et al., "Operating Characteristics of GaAs/AlGaAs FET-SEED Smart Pixels", International Electron Device Meeting, Dec. 1992.
A. L. Lentine et al., "Diode-clamped symmetric self-electro-optic effect devices with subpicojoule switching energies", *Applied Physics Letters*, vol. 60, No. 15, Apr. 13, 1992, pp. 1809–1811.
A. M. Fox et al., "Exciton saturation in electrically biased quantum wells", *Applied Physics Letters*, vol. 57, No. 22, Nov. 26, 1990, pp. 2315–2317.
K. W. Goossen et al., "Excitonic electroabsorption in extremely shallow quantum wells", *Applied Physics Letters*, vol. 57, No. 24, Dec. 10, 1990, pp. 2582–2584.
K. W. Goossen et al., "High-Power Extremely Shallow Quantum-Well Modulators", *Photonics Technology Letters*, vol. 3, No. 5, May 1991, pp. 448–450.
K. W. Goossen, et al., "Self-Biased SEED Using Highly Electroabsorptive Slightly Asymmetric Coupled Quantum Wells", Technical Digest, 1990 IEEE LEOS Annual Meeting, Boston, MA (Institute of Electrical and Electronics Engineers, New York, 1990), p. 157.
S. E. Miller et al., *Optical Fiber Telecommunications II*, pp. 695–699.
T. K. Woodward, et al., "Operation of a Fully Integrated GaAs-Alphd xGa$_{1-x}$As FET-SEED: A Basic Optically Addressed Integrated Circuit", *IEEE Photonics Technology Letters*, vol. 4, No. 6, Jun. 1992, pp. 614–617.

Primary Examiner—David C. Melms
Attorney, Agent, or Firm—Ross T. Watland

[57] ABSTRACT

An optical receiver, e.g., receiver 10 (FIG. 1), has differential optical input beams and generates an electrical output. The voltage at an electrical node between series-connected optical detector diodes is clamped within a predefined voltage range by series-connected clamping diodes, to prevent the voltage from increasing when consecutive logic one optical input beams are received. Variable bandwidth and low energy dissipation are achieved since the resistors of high input impedance and transimpedance receivers are not required. A second optical receiver, e.g., receiver 20 (FIG. 2) is a monolithic, diode-clamped S-SEED with complementary optical input beams and complementary optical output beams.

19 Claims, 3 Drawing Sheets

DIODE-CLAMPED RECEIVER
10

DIODE-CLAMPED S-SEED RECEIVER
20

TRANSMITTER/RECEIVER ARRANGEMENT
30

HIGH INPUT IMPEDANCE RECEIVER
100

TRANSIMPEDANCE RECEIVER
200

DIODE-CLAMPED OPTICAL RECEIVER

TECHNICAL FIELD

This invention relates to optoelectronic apparatus.

BACKGROUND AND PROBLEM

As photonics becomes more widely used in communications equipment, it is increasingly important to improve the performance characteristics of optoelectronic circuit elements. Several prior art designs exist for optical receivers—circuits that receive optical input beams and generate output signals, either electrical signals for further electronic processing, or regenerated optical signals.

Two such prior art designs are disclosed in *Optical Fiber Telecommunications II*, edited by Stewart E. Miller et al.—a high input impedance receiver (Miller et al., FIG. 18.4), and a transimpedance receiver (Miller et al., FIG. 18.6). Receiver 100 (FIG. 4) is a field-effect transistor (FET) implementation of a high input impedance receiver. An optical input beam P is received by a reverse-biased detector diode 102, e.g., a p-i-n diode, which is connected in series with a resistor 101, e.g., 1.0 Kohm, across a voltage source, $-V_{det} = -5.0$ volts to $-10.0$ volts. The junction between diode 102 and resistor 101 is connected to the gate of an input-stage, FET 104 (a bipolar transistor could also be used). FET 104 is connected in series with a second FET 103 at an electrical node F. FET 103 acts as an electrical load and could be replaced by a resistor. A voltage source, for example, $V_{dd} = 2.0$ volts, provides current through FET 103, and FET 104 provides variable current depending on the level of the optical input beam. The input stage (FETs 103, 104) amplifies the voltage at the FET 104 gate such that the voltage at node F varies, for example, between 0.5 volts and 1.5 volts. A level shifter—FETs 105 and 106 with a diode 107 connected therebetween—shifts the level such that electrical output Q varies between $-0.5$ volts and $+0.5$ volts ($-V_{SS} = -1.0$ volts to $-1.5$ volts).

Receiver 200 (FIG. 5) is an FET implementation of a transimpedance receiver. In receiver 200, diodes 202 and 207 correspond to diodes 102 and 107 of receiver 100 (FIG. 4); FETs 203, 204, 205, 206 in receiver 200 (FIG. 5) correspond to FETs 103, 104, 105, 106 in receiver 100 (FIG. 5). The output electrical signal S is fed back via a resistor 201 to the gate of FET 204. The gain of receiver 200 is more dependent on the value of resistor 201 than on the characteristics of the FETs. The input impedance is lower than that of receiver 100 (FIG. 4); accordingly, receiver 200 operates faster than receiver 100.

Both the high input impedance receiver and the transimpedance receiver have some serious disadvantages. The bandwidth of the receivers is fixed, based on the resistor values, rather than variable. A substantial amount of optical signal energy is dissipated in the resistors of the two receivers. Retiming is difficult to achieve. Both the high input impedance receiver 100 and the transimpedance receiver 200 have a single-ended optical input; differential optical input variations of the two designs require many more transistors and are therefore both costly and complex.

SUMMARY OF THE INVENTION

These disadvantages are overcome and a technical advance is achieved in accordance with the principles of the invention in a first exemplary embodiment of an optical receiver, e.g., receiver 10 (FIG. 1), which has differential optical input beams, e.g., A and $\overline{A}$, without being costly and complex, and which generates an electrical output. The voltage at an electrical node, e.g., node X, between series-connected optical detector diodes is advantageously clamped within a predefined voltage range by series-connected clamping diodes, to prevent the voltage from varying too far up or down when consecutive logic zero or consecutive logic one optical input beams are received. Variable bandwidth and low energy dissipation are achieved since the resistors of the high input impedance and transimpedance receivers are not required.

Apparatus in accordance with the invention includes first and second detectors connected in series at a first electrical node. The detectors are responsive to complementary optical input beams to develop a voltage at the first electrical node. The apparatus further includes a clamping means for clamping the voltage at the first electrical node within a predefined voltage range, and means for generating an output signal in response to the clamped voltage.

Illustratively, the first and second detectors, the clamping means and the generating means comprise a monolithic integrated circuit. The generating means includes a transistor, e.g., an FET, having a control input terminal connected to the first electrical node, an electrical load, e.g., an FET, connected in series with the transistor at a second electrical node, e.g., node Y, and a level-shifting stage connected to the second electrical node for generating the electrical output signal. The clamping means is implemented as first and second diodes connected in series at a point which is electrically connected to the first electrical node.

A second exemplary embodiment of the invention is shown as diode-clamped S-SEED receiver 20 in FIG. 2. The apparatus of the second exemplary embodiment includes first and second detectors connected in series at an electrical node, e.g., node Z. The detectors are responsive to complementary optical input beams to develop a voltage at the electrical node. The apparatus further includes a clamping means for clamping the voltage at the electrical node within a predefined voltage range, and means for generating an output signal in response to the clamped voltage. The first and second detectors, the clamping means and the generating means comprise a monolithic integrated circuit.

Illustratively, the generating means comprises a first multiple quantum well region within the first detector, and a second multiple quantum well within the second detector. The first and second detectors make up an S-SEED. The first detector is connected to a voltage $V_1$, and the second detector is connected to a voltage $V_2$. The clamping means includes first and second diodes connected in series at a point which is electrically connected to the electrical node. The first diode is connected to a voltage $V_3$, and the second diode is connected to a voltage $V_4$.

Illustratively, the first and second detectors are the diodes of the S-SEED. $V_4 > V_2$ and $V_3 < V_1$ such that the S-SEED diodes are reverse biased. More specifically, $(V_4-V_2) = (V_1-V_3)$ for symmetric bistable operation.

DRAWING DESCRIPTION

DETAILED DESCRIPTION

First Embodiment: Diode-clamped Optical Receiver

Figure 1:
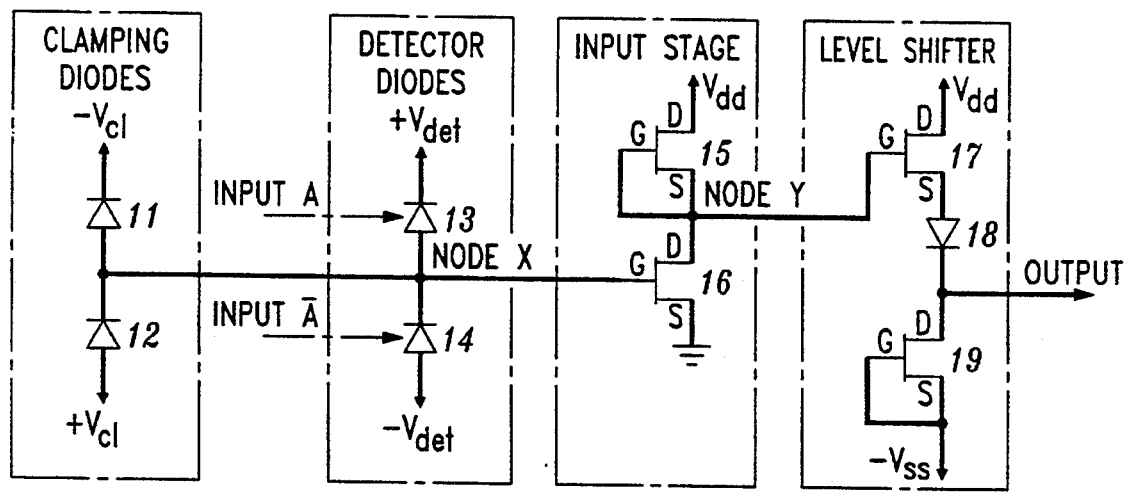
FIG. 1 is a circuit diagram of a first diode-clamped receiver embodiment in accordance with the invention.
Figure 4:
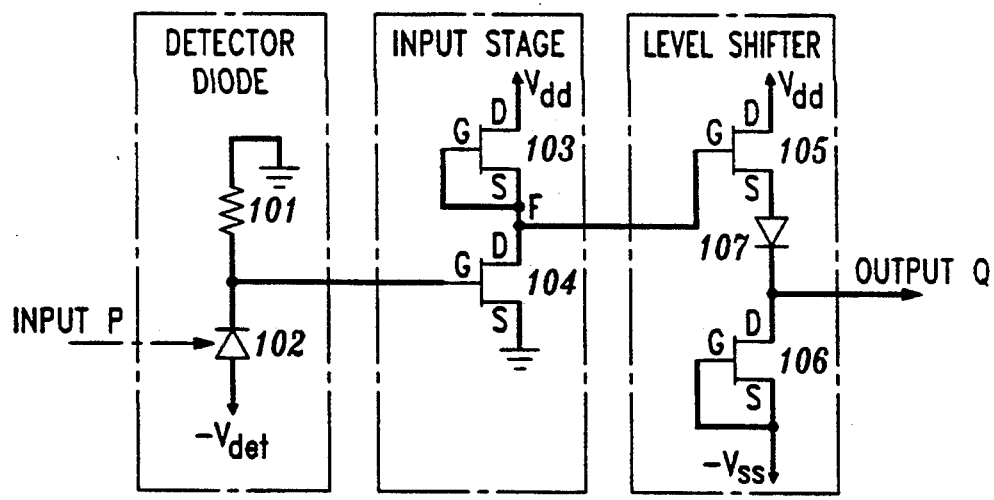
FIG. 4 is a circuit diagram of a prior art, high input impedance receiver.
Figure 5:
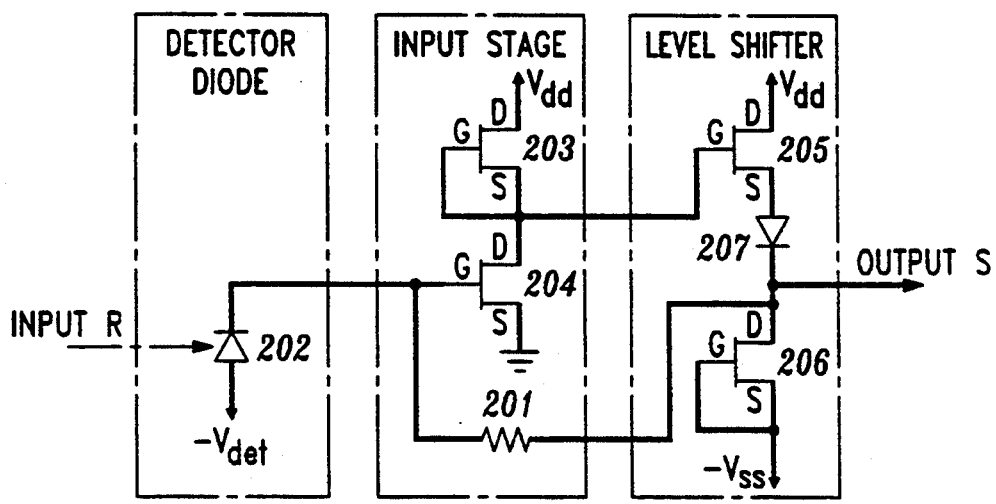
FIG. 5 is a circuit diagram of a prior art, transimpedance receiver.

FIG. 1 is a circuit diagram of an illustrative, diode-clamped optical receiver 10 which is a first exemplary embodiment of the present invention. Receiver 10 comprises four sections—a clamping section comprising series-connected diodes 11 and 12, a detector section comprising series-connected detector diodes 13 and 14, an input stage comprising series-connected FETs 15 and 16, and a level shifter stage comprising series-connected FETs 17 and 18 with a diode 18 connected therebetween. The junction between the clamping diodes 11 and 12 is connected to the junction between the detector diodes 13 and 14 at a first electrical node X. Node X is connected to the gate input of FET 16. The junction between FETs 15 and 16 is connected via a second electrical node Y to the gate input of FET 17. The voltage sources of receiver 10 are given as follows: $V_{dd}=2.0$ volts; $-V_{SS}=-1.0$ volts to $-1.5$ volts; $+V_{det}=5.0$ volts to 10.0 volts; $-V_{det}=-5.0$ volts to $-10.0$ volts; $+V_{cl}=0.5$ volts and $-V_{cl}=0.5$ volts. To understand the operation of receiver 10, consider a case where the clamping diodes 11 and 12 are not connected to node X and where the input optical beams A and $\overline{A}$ cause node X to vary from $-0.2$ volts to $+0.2$ volts. If a string of consecutive logic ones are received, the voltage at node X will increase from 0.2 volts to 0.6 volts for a second logic one, from 0.6 volts to 1.0 volts, for a third logic one etc. If a string of consecutive logic zeroes are received, the voltage at node X will decrease from $-0.2$ volts to $-0.6$ volts for a second logic zero, from $-0.6$ volts to $-1.0$ volts, for a third logic zero etc. By connecting the junction of the clamping diodes 11 and 12 to node X, the voltage at node X is restricted between 0.2 volts and $-0.2$ volts. In receiver 10, clamping diodes 11 and 12 are Schottky diodes having a forward voltage of 0.7 volts. (Alternatively, diodes 11 and 12 could be p-i-n diodes with or without multiple quantum wells.) If optical input beam $\overline{A}$ is high, the voltage at node X goes down to $-0.2$ volts, at which point clamping diode 12 is forward biased by 0.7 volts and current will flow from $+V_{cl}$ up through clamping diode 12, through node X, and down through detector diode 14 to $-V_{det}$. If optical input beam A is high, the voltage at node X increases to 0.2 volts, at which point clamping diode 11 is forward biased by 0.7 volts and current flows from $+V_{det}$ down through detector diode 13, through node X, and up through clamping diode 11 to $-V_{cl}$. This prevents the voltage buildup that would otherwise occur if the clamping diodes 11 and 12 were not included in receiver 10. Note that receiver 10 has differential, complementary, optical input beams. The bandwidth is variable. If 100 nanowatt input optical beams were applied, the voltage at node X will gradually move to $+0.2$ volts or $-0.2$ volts depending on which of the complementary optical input beams is high. In contrast, the corresponding voltage swings in prior art receiver 100 (FIG. 4) and prior art receiver 200 (FIG. 5) are determined by the product of the resistor value and the photocurrent. If higher power optical input beams are applied in receiver 10 (FIG. 1), the voltage at node X will more rapidly move to $+0.2$ volts or $-0.2$ volts.

Because of clock skew, each of the receivers 10, 100 and 200 need to perform retiming. In receiver 10, if short duration pulses are applied as optical input beams A and $\overline{A}$, the voltage at node X will move to 0.2 volts or $-0.2$ volts ; when the pulse is removed, the voltage at node X will stay constant for a time period until the leakage current of the diodes and FETs discharges the voltage. This is in contrast to receivers 100 and 200 where the voltage is rapidly discharged through a resistor. Therefore, there is no need in receiver 10 for an additional latch circuit in order to perform retiming. Because no resistor is required, receiver 10 uses optical energy on the order of 10 times more efficiently than receivers 100 and 200. In circuit 10, detector diodes 13 and 14 are p-i-n diodes including multiple quantum wells; detector diodes 13 and 14 could alternatively be p-i-n diodes without multiple quantum wells. Phototransistors could also be substituted for detector diodes 13 and 14. Optical input beams A and $\overline{A}$ could be continuous wave beams rather than pulses. Note that the restricted voltage range at node X is variable; the voltages $+V_{cl}$ and $-V_{cl}$ can be varied or clamping diodes having different forward bias voltages can be substituted.

Receiver 10 is implemented as a monolithic integrated circuit. The operation of receiver 10 can be better understood by reviewing the following description of a transmitter/receiver arrangement 30 (FIG. 3) where diodes 31, 32, 33, and 34 and FETs 35 and 36 correspond to diodes 11, 12, 13, and 14 and FETs 15 and 16 in receiver 10. Instead of the level shifter of receiver 10, a transmitter comprising FETs 37 and 38 and S-SEED diodes 39 and 40 is included.

Figure 3:
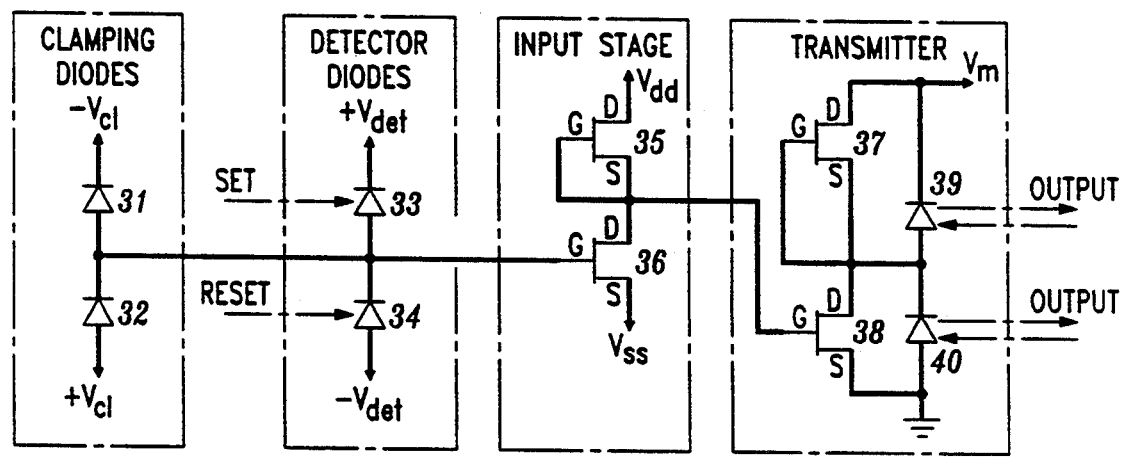
FIG. 3 is a circuit diagram of a transmitter/receiver arrangement used to further describe the receiver of FIG. 1.

Transmitter/Receiver Arrangement 30 (FIG. 3)

Monolithic optically addressed integrated circuits have been realized. The optical element is a p-i-n multiple quantum well (MQW) device designed for normal incidence operation as both a detector and an optical modulator for 850 nm light. Electronic circuits are realized in GaAs/AlGaAs doped-channel heterojunction field effect transistors (HFETs) with buffered FET logic.

A crucial step toward the realization of practical optical interconnection between electrical processing elements at the massively parallel scale is the monolithic integration of a controllable optical element with semiconductor microelectronics. To this end, GaAs field effect transistor (FET) technology has been integrated with GaAs multiple quantum well (MQW) light modulators, the combination of which are referred to as FET-SEEDs. This technology is disclosed in a paper by T. K. Woodward et al., "Operation of a Fully Integrated GaAsAl$_x$Ga$_{1-x}$As FET-SEED: A Basic Optically Addressed Integrated Circuit", *IEEE Photonics Technology Letters*, Vol. 4, No. 6, June 1992, pp. 614–617. Doped-channel heterojunction field-effect transistors (HFETs), also known as doped-channel MIS-like FETs (DMTs), are used as the GaAs electronic component.

FET

Planar process technology has been developed that permits the integration of both modulator and transistor in a planar process requiring a single growth step. Growth of the structure is by molecular beam epitaxy. It is important to note that the total epitaxial layer thickness is quite large, roughly 3.5 μm, owing to the presence of the $Al_xGa_{1-x}As/AlAs$ dielectric reflector stack. The process permits the realization of circuits with varying degrees of complexity, using FETs that are currently entirely depletion mode. Typically, $g_m \sim 90$ mS/mm and $V_{th} \simeq -1$ V. The channel consists of a 900 Å $Al_{0.11}Ga_{0.89}As$ undoped spacer and 120 Å of GaAs doped n-type to $1 \times 10^{18}$ cm$^{-3}$. The very heavily-doped GaAs cap permits good source and drain contacts while having negligible optical absorption at 850 nm. Of particular importance is the ability to independently contact the p-type layer underlying the circuitry. This prevents back-gating and provides a ground plane beneath the devices.

Modulator

The multiple quantum well (MQW) section underlying the FET-layers performs both detection (at the input) and signal modulation (at the output). A dielectric reflector is grown underneath the p-i-n diode to permit operation in reflection. The top surfaces of these devices are anti-reflection coated, although asymmetric Fabry-Perot modulators have also been realized. The modulator operating point is designed to lie beyond the zero bias excitonic peak to increase the high state reflectivity as well as the change in reflectivity. To maintain reasonable contrast ratios, 95 quantum wells are placed in the MQW region, each being 90 Å thick with 35 Å $Al_{0.3}Ga_{0.7}As$ barriers.

FIG. 3 is a circuit diagram of receiver/transmitter arrangement 30 with no logic between the receiver and the transmitter. The leftmost transistor pair 35, 36 with the associated input detector diodes 33, 34 functions as a simple receiver and has 8 μm wide FETs, generating a logic level voltage from the received optical power. The rightmost transistor pair 37, 38 (10 μm wide) drives two diodes 39, 40 operated as modulators that generate the reflected optical output signal when illuminated by externally supplied lasers near 850 nm. The transistors required to drive the output need not have large current drive capacity. For 50 Ω electrical pad drivers, FETs that are 400 μm wide are used, as compared to the 10 μm used for the optical output drivers in the circuit of FIG. 3. Of particular importance for this circuit is the input optical energy required to generate an optical output.

FIG. 3 illustrates an input diode configuration, referred to as "diode-clamped" inputs. In this configuration, two diodes are used as detectors and two diodes are biased slightly forward to restrict the input voltage swing. If the gate voltage exceeds the forward turn-on voltage of these clamping diodes, they begin to conduct, preventing the input from charging to high potential. The configuration of FIG. 3 has been operated at 100 MHz (200 Mb/s) with an input optical energy (in each beam) of 40 (set), and 34 (reset) fJ.

Charge deposited at the gate of the input stages of FIG. 3 leaks off very slowly in the dark, because the dark currents flowing from this node are very low. Thus, short pulses may be used to abruptly deposit charge there, with negligible leakage during a bit period. Intuitively, this "dynamic latching" is advantageous because the output current of the driver FET is immediately switched to its maximum or minimum value, rather than ramping continuously over the bit period. Thus, a given optical input energy is utilized more efficiently when delivered abruptly at the start of the bit period than when distributed uniformly over the bit period. The circuit has been operated with pulsed optical inputs having only 28 (set) and 13 (reset) fJ of energy. However, when 50 percent duty cycle square wave inputs were provided at 200 MHz, 135 (set) and 144 (reset) fJ of energy were required in the bit period. Precise energies depend on clamping and detector biases.

Second Embodiment: Diode-clamped symmetric self-electro-optic effect devices with subpicojoule switching energies At the present time, electrical logic devices, i.e., logic devices whose states are switched electrically, are pervasively used in applications such as computers, telecommunications switches, etc. However, much effort has been directed toward the development of optical logic devices, i.e., devices whose states are switched and read optically, in the hope that such devices could utilize the high spatial bandwidth of free space optics to connect large two dimensional arrays of optical logic devices. Such a configuration would make applications such as parallel processing relatively straightforward and more easily implemented than with electrical logic devices.

Those skilled in the art have directed much effort toward the fabrication of such devices and arrays. For example, a p-i (MQW) -n structure exhibiting the quantum confined Stark effect (QCSE) has been developed. MQW is an acronym for multiple quantum well. This structure is referred to as a SEED diode. A SEED diode connected in series with another element acting as a load forms a SEED which is an acronym for self-electro optic effect device. If the load is another reverse biased SEED diode, a symmetric SEED (S-SEED) is formed. The S-SEEDs can be easily fabricated in arrays. The reflectivity and the responsivity are functions of both the optical wavelength and the applied voltage due to the quantum confined Stark effect. These devices are now well known to those skilled in the art and need not be described in detail. See, for example, U.S. Pat. No. 4,754,132 issued to H. S. Hinton et al. on Jun. 28, 1988.

Symmetric self-electro-optic effect devices (S-SEEDs) are described herein with clamping diodes connected to the center node of the devices to ensure both diodes of the S-SEEDs have an electric field across them at all times. These diode-clamped S-SEEDs operate over a greater wavelength range, with greater powers before saturating, and have lower optical switching energies compared to conventional S-SEEDs. An $8 \times 8$ array of diode-clamped S-SEEDs has been built and tested. Bistable operation has been demonstrated with voltage swings of only 2 V over a wavelength range of 15 nm. Required optical switching energies of 340–580 fJ were measured at input powers from 500 nW to 100 μW for devices with $10 \times 10$ μm mesas. This is the lowest reported switching energy for any SEED with acceptable bistable characteristics without electronic amplification.

Quantum well self-electro-optic effect devices (SEEDs) are one of the leading candidates for use in optical signal processing systems. Although arrays of devices have been made for several years, recent advances in optimizing the quantum well material has enhanced device performance. Some of this research has focused on the design of the barriers. For example, quantum well modulators with 35 Å $Al_{0.3}Ga_{0.7}As$ barriers have much faster carrier escape times and higher saturation intensities compared to devices with 60 Å $Al_{0.3}Ga_{0.7}As$ barriers. As a result of these faster carder escape times, the intrinsic switching speed of symmetric SEEDs (S-SEEDs) improved from 860 ps for 60 Å barrier devices to 33 ps for 35 Å barrier devices.

In SEEDs made using small area mesa diodes, recombination of carriers at the mesa sidewalls can reduce the photocurrent if the recombination times are comparable to the carrier escape times. This is most noticeable at low electric fields because the carrier escape times are much longer at low fields compared to high fields. Bistable SEEDs require operation with the exciton peak in photocurrent occurring at low fields. Therefore, the excitonic peak in photocurrent is reduced and the device requires more voltage for bistability and has a narrower bistable loop width compared to larger devices without surface recombination. Improving the carrier escape times by reducing the barrier width from 60 Å to 35 Å increased the excitonic peak in photocurrent and reduced minimum applied voltage required for bistable operation from $\sim 10$ volts to less than 3 V for S-SEEDs with $13 \times 14$ μm mesas and $10 \times 10$ μm mesas.

Strong low-field absorption and even faster carrier escape times are seen in devices with ultrashallow $Al_{0.02}Ga_{0.98}As$ barriers. These devices have no excitonic peak in the absorption for applied fields greater than a few volts per micrometer, so that the change in absorption is larger for a small applied voltage than a conventional design. The photocurrent peak in the absorption can occur at applied voltages less than zero, that is, the peak occurs in forward bias at voltages less than the built in voltage, $V_{bi}$. Because of this, a self-biased S-SEED has been made that shows bistability without a power supply. However, the mesa areas in these devices were sixteen times larger than the devices described herein. Self-biased S-SEEDs have also been made using large area mesa diodes with asymmetric coupled wells and double heterostructure GaAs/AlGaAs photodiodes.

Figure 2:
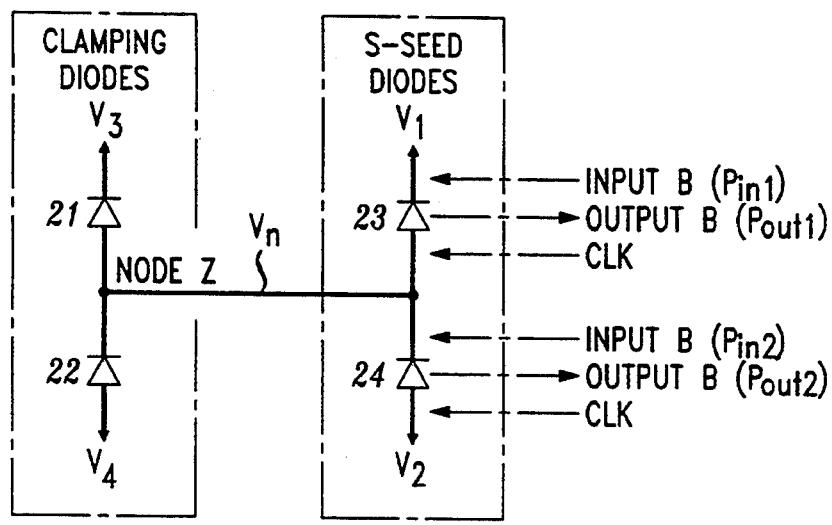
FIG. 2 is a circuit diagram of a second diode-clamped receiver embodiment in accordance with the invention.

A diode clamping circuit is described herein that retains the excitonic peak in the photocurrent of devices with conventional well and barrier designs by ensuring that a moderately large (a few volts/micrometer) electric field is present across each diode of the S-SEED at all times. A schematic diagram of the device is shown in FIG. 2. Diode-clamped S-SEED receiver 20 comprises two S-SEED diodes 23, 24 and a pair of clamping diodes 21, 22 connected at the center node Z of the S-SEED. In a standard S-SEED, in each of its two stable states one of the two diodes will be in forward bias and have a low field across it. That is unfortunate, because the carrier escape times decrease, saturation intensities increase, and photocurrent collection efficiency increases as the electric field increases across a diode. By ensuring that the voltage across the clamping diodes is less than that across the S-SEED diodes ($V_4 > V_2$ and $V_3 < V_1$), the S-SEED diodes will always be reverse biased.

The state of receiver 20 is determined by the node Z voltage, $V_n$. If $V_n$ is initially low and complementary input signals B and $\bar{B}$ are applied with optical powers such that $P_{in1} > P_{in2}$, $V_n$ will start to rise because the photocurrent in diode 23 will be greater than the photocurrent in diode 24. However, when $V_n$ becomes greater than $\sim (V_3 + 1)$, the forward current of diode 21 will oppose the photocurrent of diode 23 and prevent the voltage from rising any further. Therefore, the node Z voltage will always be less than $\sim (V_3 + 1)$ and the reverse bias voltage across diode 23 will always be greater than $V_1 - (V_3 + 1)$. By a similar argument, if arrangement 20 is switched to its low state by the application of input signals with optical powers such that $P_{in2} > P_{in1}$, the node Z voltage cannot be less than $\sim (V_4 - 1)$ and the reverse biased voltage across diode 24 can never be less than $\sim (V_4 - 1 - V_2)$.

For symmetric bistable operation of receiver 20, $V_4 - V_2$ should be equal to $V_1 - V_3$. The wavelength of operation should be chosen such that the excitonic peak in photocurrent occurs at the minimum voltage across each diode. This voltage is given by $\sim (V_1 - V_3 - 1)$ or $\sim (V_4 - 1 - V_2)$. Since the excitonic peak in absorption red-shifts to longer wavelengths when a field is applied, the wavelength of operation will be longer than the wavelength of the excitonic peak at zero field.

Both individual diode-clamped S-SEEDs and an $8 \times 8$ array of diode-clamped S-SEEDs have been made. The clamping diodes are $5 \times 10$ μm mesa diodes without optical windows and the S-SEED diodes are $10 \times 10$ μm mesa diodes with $5 \times 10$ μm optical windows. The unit cell size for the $8 \times 8$ array of devices is $40 \times 40$ μm. The devices were reflection mode devices made on an $Al_{0.11}Ga_{0.89}As/AlAs$ dielectric mirror. The quantum well region contained 60.5 periods of 100 Å GaAs wells with 35 Å $Al_{0.3}Ga_{0.7}As$ barriers, for a total intrinsic region thickness of $\sim 0.817$ μm.

The diode clamped S-SEEDs have the important attribute of extending the wavelength range of the devices, whereas both the ultrashallow, (K. W. Goossen, et al., *Applied Physics Letters*, 57, 2582 (1990), and coupled well designs (K. W. Goossen, et al., *Technical Digest*, 1990, IEEE LEOS Annual Meeting, Boston, Mass., (Institute of Electrical and Electronics Engineers, New York, 1990, p. 157), restrict the wavelength range to achieve improved performance compared to conventional designs. This operating wavelength is tunable by adjusting the voltages, although the absolute minimum reflectivity and thus maximum contrast ratio is reduced as the wavelength is increased further away from the zero-field excitonic peak. Self-biased operation was observed from 1 to 15 nm above the zero-field excitonic peak at 848 nm, with a contrast ratio greater than 2:1 from 850 to 852 nm. Greater wavelength ranges and greater contrast ratios were observed when $V_3 > V_4$ and the voltage was allowed to swing by more than $\pm V_{bi}$.

Self-biased bistability was observed at average input powers up to $\sim 200$ μW, but at this power the bistable loop was narrow. This is because the forward bias voltage drop across the clamping diodes is greater at higher currents, thus the nearly vertical I-V characteristic of the clamping diode as it goes into forward bias at low currents was not vertical at these currents. In spite of this, these devices have improved saturation characteristics compared to devices with conventional barrier designs (A. M. Fox et al., *Applied Physics Letters*, 57, 2315 (1990)), approaching the performance of ultrashallow barriers (K. W. Goossen, et al., *IEEE Photon Technology Letter*, 3, 448 (1991)). Self-biased bistable operation was observed at powers less than 4 nW, limited by the leakage currents of the S-SEED diodes.

The required optical switching energy was measured for a diode clamped S-SEED by applying a single low power pulse to one diode at a time. When the pulse is initially present, that output is in its high state, and after a period of time the output switches to its low state. By integrating the power in the pulse until switching is completed, the amount of energy that was supplied is known. A later pulse incident on the other p-i-n diode returns the device to its original state. Because the device can hold its state when both signals are removed, the two pulses need not overlap. A pair of acousto-optically modulated Ti:Sapphire laser beams at 850.9 nm were used to generate the pulses for low speed measurements and a semiconductor laser diode, also at 850.9 nm, with an acousto-optically modulated reset beam for high speed measurements. The S-SEED was biased at 0 and 7 V and both of the clamping diodes were biased at 3.5 V. At 530 nW, the required optical energies and (switching times) were ~340 fJ (~640 ns) rising to ~480 fJ (~8.9 ns) at 54 $\mu$W and ~580 fJ (~5.8 ns) at 100 $\mu$W. The increased switching energy at higher powers could have been due to the contribution of the 1 ns response time of the detector as well as some saturation of the absorption of the quantum well material in the device.

The symmetric self-electro-optic effect devices with clamping diodes connected to the center node Z of the arrangement 20 ensure that both diodes of the S-SEED have an electric field across them at all times. By adjusting the voltages on the devices, the operating range of the devices can be extended several nanometers above the zero-field excitonic peak wavelength. Self-biased operation with voltage swings of less than 2 $V_{bi}$, corresponding to an applied electric field swing of 2.4 $\mu$m, has been achieved at optical powers up to 200 $\mu$W. Because of this low electric field swing, switching energies from 340–580 fJ have been measured at optical powers ranging from ~500 nW to 100 $\mu$W.

It is to be understood that the above-described embodiments are merely illustrative of the principles of the invention and that many variations may be devised by those skilled in the art without departing from the spirit and scope of the invention. It is therefore intended that such variations be included within the scope of the claims.

We claim:

1. Apparatus comprising
   first and second detector means connected in series at a first electrical node, said first detector means responsive to an optical input signal beam and said second detector means responsive to an optical beam that is complementary to said optical input signal beam, said first and second detector means for developing a voltage at said first electrical node in response to said optical input signal beam and said complementary optical beam,
   means connected to said first electrical node for clamping said voltage within a predefined voltage range, and
   means responsive to said clamped voltage for generating an electrical, output signal.

2. Apparatus in accordance with claim 1 where said first and second detector means, said clamping means, and said generating means comprise a monolithic integrated circuit.

3. Apparatus in accordance with claim 1 where said generating means comprises
   transistor means having a control input terminal connected to said first electrical node, and
   electrical load means connected in series with said transistor means at a second electrical node.

4. Apparatus in accordance with claim 3 where said transistor means and said electrical load means are both FETs.

5. Apparatus in accordance with claim 3 where said generating means further comprises
   level-shifting means connected to said second electrical node for generating said output signal.

6. Apparatus in accordance with claim 1 where said clamping means comprises first and second diode means connected in series at a point which is electrically connected to said first electrical node.

7. Apparatus in accordance with claim 6 where said first and second diode means are Schottky diodes.

8. Apparatus in accordance with claim 6 where said first and second diode means are multiple quantum well p-i-n diodes.

9. Apparatus in accordance with claim 6 where said first and second diode means are p-i-n diodes without multiple quantum wells.

10. Apparatus in accordance with claim 1 where said first and second detector means are multiple quantum well p-i-n diodes.

11. Apparatus in accordance with claim 1 where said first and second detector means are p-i-n diodes without multiple quantum wells.

12. Apparatus in accordance with claim 1 where said first and second detector means are phototransistors.

13. Apparatus in accordance with claim 1 where said optical input signal beam and said complementary optical beam are streams of pulses for dynamic operation.

14. Apparatus in accordance with claim 1 where said optical input signal beam and said complementary optical beam are continuous wave beams.

15. Apparatus comprising
    first and second detector means connected in series at an electrical node, said first detector means responsive to an optical input signal beam and said second detector means responsive to an optical beam that is complementary to said optical input signal beam, said first and second detector means for developing a voltage at said electrical node in response to said optical input signal beam and said complementary optical beam,
    means connected to said electrical node for clamping said voltage within a predefined voltage range, and
    means responsive to said clamped voltage for generating complementary, optical output beams,
    where said first and second detector means, said clamping means, and said generating means comprise a monolithic integrated circuit.

16. Apparatus in accordance with claim 15 where said generating means comprises a first multiple quantum well region within said first detector means and a second multiple quantum well region within said second detector means.

17. Apparatus in accordance with claim 15 where said clamping means comprises first and second diode means connected in series at a point which is electrically connected to said electrical node, where said first and second detector means collectively comprise an S-SEED, where said first detector means is connected to a voltage $V_1$, said second detector means is connected to a voltage $V_2$, said first diode means is connected to a voltage $V_3$, and said second diode means is connected to a voltage $V_4$.

18. Apparatus in accordance with claim 17 where said first and second detector means are diode means of said S-SEED, where $V_4 > V_2$ and $V_3 < V_1$ such that said S-SEED diode means are reverse biased.

19. Apparatus in accordance with claim 18 where $(V_4 - V_2) = (V_1 - V_3)$.

* * * * *